United States Patent [19]

Sakai

[11] Patent Number: 4,894,310

[45] Date of Patent: Jan. 16, 1990

[54] PHOTO-SENSITIVE RECORDING MEDIUM

[75] Inventor: Jun Sakai, Nagoya, Japan

[73] Assignee: Brother Kogyo Kabushiki Kaisha, Aichi, Japan

[21] Appl. No.: 290,650

[22] Filed: Dec. 27, 1988

[30] Foreign Application Priority Data

Dec. 28, 1987 [JP] Japan .................. 62-333336
Jan. 14, 1988 [JP] Japan .................... 63-5941

[51] Int. Cl.⁴ .............................................. G03C 1/72
[52] U.S. Cl. ............................... 430/138; 503/215; 264/4.3; 428/402; 428/406; 427/150
[58] Field of Search .................. 430/138; 503/215; 264/4.3; 428/402, 406; 427/150

[56] References Cited

U.S. PATENT DOCUMENTS 4,740,443 4/1988 Nakahara et al. ............... 430/138

FOREIGN PATENT DOCUMENTS 17432 2/1983 Japan .
57236 3/1986 Japan .
39844 2/1987 Japan .

Primary Examiner—Hoa Van Le
Attorney, Agent, or Firm—Kane, Dalsimer, Sullivan, Kurcz, Levy, Eisele and Richard

[57] ABSTRACT

The improved photo-sensitive recording medium carrying the photo-curing microcapsules, capable of minimizing the variation of its "sensitivity" and therefore the image recording speed at the time when the optical image is exposed.

A stable "sensitivity", which makes a duplicating operation stable in any environmental conditions, is obtained by fabricating the capsule walls of the photo-curing microcapsules with inorganic substances.

5 Claims, 1 Drawing Sheet

PHOTO-SENSITIVE RECORDING MEDIUM

BACKGROUND OF THE INVENTION

This invention relates to a photo-sensitive recording medium coated with a slurality of photo-sensitive microcapsules.

There has been proposed a photo and pressure sensitive recording medium, such as disclosed in Japanese Patent Provisional Publication Sho62-39844, which is coated with photo-curable microcapsules each containing a dyeing pigment. This recording medium is exposed to an optical image so as to form a latent image thereon. The recording sheet is then laid on a plain paper to be pressed together to develop a visible image on the plain paper.

Further, there has been proposed another photo and pressure sensitive recording medium, such as disclosed in Japanese Patent Provisional Publication Sho58-17432, containing a chromogenic material. This recording medium is exposed to an optical image so as to form a latent image thereon. The recording medium is then laid on a developer sheet carrying a developer which develops a color when brought into contact with the above chromogenic material, to be pressed together to develop a visible image on the developer sheet. It should be noted that, by placing the photo-sensitive microcapsules and the developer on the recording medium, it becomes unnecessary to employ a separate developer sheet.

In both the above cases, however, it has been found that the sensitivity of the photo-sensitive recording medium considerably decreases in case the ambient temperature and/or humidity become high during operation on due to the locations, and the time required to sufficiently cure the microcapsules becomes longer. In other words, the image duplication speed becomes slow.

SUMMARY OF THE INVENTION

It is therefore an object of this invention to provide an improved photo-sensitive recording medium whose sensitivity hardly changes with varying environmental conditions.

For this purpose, according to this invention, there is provided a photo-sensitive recording medium comprising:
a sheet shaped supporting member; and
microcapsules coated on said supporting member, each of said microcapsules comprising a capsule wall made of an inorganic material and enveloping therein a photo-curing substance and a color component.

That is, the present inventor has repeated the experiments and formed that the curing speed of the microcapsules be considerably affected by the permeability of the walls of the microcapsules. In other words, if the capsule wall has the high permeability, the photo-curing substances enveloped in the microcapsules easily get oxygens from outside through the capsule wall, which makes the energy required to cure the photo-curing substances large. Further, if the humidity is high, same as the above can be said.

Since the capsule walls have been conventionally made by organic materials such as natural or synthetic macromolecules, the amount of oxygen passing through the capsule walls have largely depended on variation of ambient temperatures and humidities.

According, the present invention proposes to prepare the capsule walls by inorganic materials, whose permeability is hardly affected by the surrounding temperatures.

DESCRIPTION OF THE ACCOMPANYING DRAWINGS

DESCRIPTION OF THE EMBODIMENT

A preferred embodiment of the invention is now described with reference to the accompanying drawings.

Figure 1:
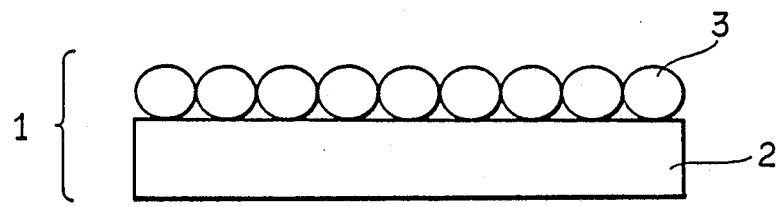
FIG. 1 is a sectional view showing the basic structure of a photo-sensitive recording medium embodying the invention.
Figure 2:
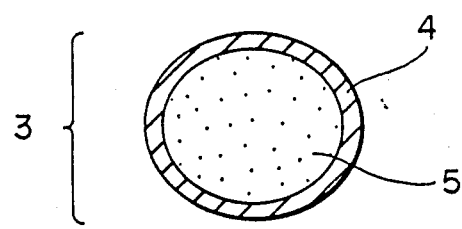
FIG. 2 is an enlarged sectional view showing a structure of a photo-sensitive microcapsule.

FIG. 1 shows a photo-sensitive recording medium 1 comprising photo-sensitive microcapsules 3 coated on a carrier 2. As shown in FIG. 2, a core material 5, which comprises a photo-sensitive resin and a dyeing pigment, is enclosed in a cavity defined by an inorganic capsule wall 4.

The carrier 2 may be of a plain paper, a plastic film of polyester (PET), polyethylene, polypropylene, vinyl chloride, polycarbonate, glass and thin metal plate. As the materials of the inorganic capsule wall 4, silicates of alkaline-earth metals such as calcium silicate, oxides of alkaline-earth metals such as calcium oxide, carbonates of alkaline-earth metals such as calcium carbonate and calcium sulfate and silica sulfate (silicic acid anhydrate) can be used (More particularly, refer to Japanese Patent Provisional Publication Sho61-57236).

As the photo-sensitive resin materials of the core 5, photo-polymerizing resins in th acryl or vinyl group, photo-setting mixtures provided by combination of a photo-dimerizing resin in the cinnamic acid group with a photo-polymerization initiator such as benzophenone, Michler's ketone and thioxantone, and photo-decomposing resins in the diazonium chloride and chinonediazide group can be used (More particularly, refer to Japanese Patent Provisional Publication Sho62-39844 or Sho58-17432).

The following substances can be used as dyeing pigments.

As white pigments used are hydrozincite, white lead sulfate, basic sulfate, lithopone, zinc chloride, lead sulfate, basic sulfate, lithopone, zinc chloride, titanium oxide and antimony oxide.

As black pigments used are carbon black, acetylene black, lamp black, bone black, graphite, iron black, mineral black, aniline black and cyanine black.

As yellow pigments used are chrome yellow, zinc yellow, barium chromate, cadmium yellow, iron oxide, loess, titanium yellow, lead cyanamide, calcium hydrochloride, naphtol yellow S, Hansa yellow 10G, Hansa yellow 5G, Hnsa yellow 3G, Hansa yellow G, Hansa yellow GR, Hansa yellow A, Hansa yellow RN, Hansa yellow R, pigment yellow, benzidine yellow, benzidine yellow G, benzidine yellow GR, permanent yellow NCG, Vulcan fast yellow 5G, Vulcan fast yellow R, tartrazine lake, quinoline yellow lake, anthragen yellow 6GL, permanent yellow FGL, permanent yellow H10G, permanent yellow HR and anthrapyrimidine yellow.

As orange pigments used are chrome orange, chrome vermilion, Sudan I, permanent orange, lithol fast orange, permanent orange GTR, Hansa yellow 3R, Vulcan fast orange GG, benzidine orange G, Persian orange, indathrene brilliant orange GK, indathrene brilliant orange RK and indathrene brilliant orange.

As brown pigments used are iron oxide, amber, permanent brown and parabrown.

As red pigments used are iron red, minium, silver vermilion, cadmium red, cadmium mercury red, antimony vermilion, permanent red 4R, parared, fire red, parachrolorthonitroaniline red, lithol fast scarlet G, brilliant fast scarlet, cochineal lake, brilliant carmine BS, permanent red F2R, permanent red F4R, permanent red FRL, permanent red FRLL, permanent red F4RH, fast scarlet VD, Vulcan fast rubine B, Vulcan fast pink G, light fast red toner B, light fast red toner R, permanent FB, pyrazolone red, lithol red, lake red C, lake red D, anthosin B, brilliant scarlet G, lithol rubin GK, permanent red F5R, brilliant carmine 6B, pigment scarlet 3B, bordeaux 5B, toluidine maroon, permanent bordeaux F2R, heliobordeaux BL, bordeaux 10B, BON maroon light, BON maroon medium, eosine lake, rohdamine lake B, rohdamine lake Y, alizarin lake, thioindigo red B, thioindigo maroon, permanent red FGR, PV carmine HR, monolight fast red YS and permanent red BL.

As purple pigments used are cobalt purple, manganese purple, fast violet B, methyl violet lake and dioxydine violet.

As blue pigments used are ultramarine blue, iron blue, cobalt blue, cellulian blue, asbolane, alkaline blue lake, peacock blue lake, victorian blue lake, non-metal phtalocyanine blue, phtalocyanine blue, fast sky blue, indathrene blue RS, indasthrene blue BC and indigo.

As green pigments used are chrome green, zinc green, chrome oxide, Vividian, emerald green, cobalt green, pimgment green B, naphtol green B, green gold, acid green lake, malachite green lake, phtalocianine green, polychrome prom and copper phthalocyanine.

The color dye that can be dissolved or dispersed in the photosetting resin or the photoresetting resin and the organic solvent may be selected from colored dyes in monoazo, disazo, metal complex monoazo, anthraquinone, phthalocyanine, triallylmethane groups. Actual color index numbers are 11020, 11021, 12055, 12700, 18690, 18820 and 47000 for yellow, 12010, 12150, 12715, 26105, 26125, 27291, 45170B and 60505 for red, 61565 for green, 61100, 61705, 61525, 62100, 42563B and 74350 for green and 12195, 26150 and 50415 for black.

The photo-sensitive microcapsules of the structure described above are prepared in the conventional way as described in Japanese Patent Provisional Publication Sho61-57236. They are then mixed with a bonding agent such as polyvinyl or zelatine to be coated over the carrier.

EXAMPLE (1)

A dispersion liquid of photo-sensitive microcapsules containing a dyeing pigment has been prepared in the following procedures.

100 ml of 4 mol/1 solution of sodium silicate has been added to 50 g of an acrylate photo-setting resin (Product name: Aronix by Toa Synthetic Chemicals Co., Ltd.) with a dissolved or dispersed content of 5 weight of carbon black and 0.2 weight % of benzoinethyleter as pigment. The liquid has been stirred and mixed to obtain a O/W type emulsion. A 500 ml benzene solution has then been added to the O/W type emulsion, shaken and mixed together to obtain a O/W/O type emulsion. Then, the O/W/O type emulsion has been stirred into 1000 ml of a 1.5 mol/1 water solution of calcium chloride for reaction. The resultant microcapsule dispersion liquid 220 g has been added to 150 g of a water solution of 10 weight % polyvinyl alcohol and 200 g water. All of them have been stirred thoroughly and coated on plain paper weighing 127 g/m$^2$ using a bar coater so that the resultant coat weights 4 g/m$^2$.

Figure 3:
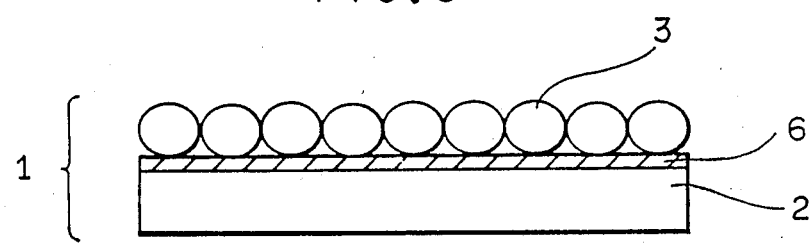
FIG. 3 is another photo sensitive recording medium embodying the invention.

FIG. 3 shows another photo-sensitive recording medium embodying the invention wherein, instead of the dyeing pigments of the earlier embodiment, the microcapsules 3, and a developer layer 6 is formed between the carrier 2 and the microcapsules 3.

As the chromogenic materials, electron donor compounds such as triallylmethane, xanthene and thiazine compounds and ligands such as gallic acid and 8-quinolinol, can be used.

EXAMPLE (2)

A dispersion liquid of photo-sensitive microcapsules containing a chromogenic material has been prepared in the following procedures.

100 ml of a 4 mol/1 solution of sodium silicate has been added to 50 g of an acrylate photo-curing resin (Product name: ARONIX by Toa Synthetic Chemicals Co., Ltd.) with a dissolved content of 2 weight % of 3,3-bis (p-dimethylaminophenyl) phtalide and 0.2 weight % of benzoinethyleter as electron donor compounds for coloring. The liquid has been stirred and mixed to obtain a O/W type emulsion. A 500 ml benzene solution has then been added to the O/W type emulsion, shaken and mixed together to obtain a O/W/O type emulsion. Then, the O/W/O type emulsion has been stirred into 000 ml a 1.5 mol/1 water solution of calcium chloride for reaction. The resultant microcapsule dispersion liquid 220 g has been added to 150 g of a water solution liquid 220 g has been added to 150 g of a water solution of 10 weight % polyvinyl alcohol and 200 g water. All of them have been stirred thoroughly and coated on plain paper weighing 127 g/m$^2$ using a bar coater so that the resultant coat weights 4 g/m$^2$.

The photo-sensitive recording mediums prepared as in the above Example (1) and (2) offer a minimum sensitivity variation with respect to environmental fluctuation, resulting in a stable duplicating operation in any environmental conditions.

What is claimed is:

1. A photo-sensitive recording medium comprising:
   a sheet shaped supporting member; and
   microcapsules coated on said supporting member, each of said microcapsules comprising a capsule wall made of an inorganic material and enveloping therein a photo-curing substance and a color component.

2. The photo-sensitive recording medium according to claim 1 wherein said inorganic material is selected from a group consisting of silicates of alikaline-earth metals such as calcium silicate, oxides of alkaline-earth metals such as calcium oxide, carbonates of alkaline-earth metals such as carbonate and calcium sulfate and silica sulfate.

3. The photo-sensitive recording medium according to claim 1 wherein said color component is a dyeing pigment.

4. The photo-sensitive recording medium according to claim 1 wherein said color component is a chromogenic material.

5. The photo-sensitive recording medium according to claim 4 which further comprises a developer which develops color when reacted to said chromogenic material is further coated on said supporting member.

* * * * *